(12) United States Patent
Signoretti et al.

(10) Patent No.: US 8,022,746 B1
(45) Date of Patent: Sep. 20, 2011

(54) BOOTSTRAP CIRCUIT FOR H-BRIDGE STRUCTURE UTILIZING N-CHANNEL HIGH-SIDE FETS

(75) Inventors: Barry Signoretti, Milpitas, CA (US); David I. Anderson, Saratoga, CA (US); Jianhui Zhang, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/027,781

(22) Filed: Feb. 7, 2008

(51) Int. Cl.
*H03K 3/00* (2006.01)

(52) U.S. Cl. ........ 327/423; 327/424; 327/390; 327/588; 327/589

(58) Field of Classification Search .................. 327/423, 327/424, 390, 588, 589
See application file for complete search history.

(56) References Cited

U.S. PATENT DOCUMENTS

| | | | |
|---|---|---|---|
| 4,316,243 A | 2/1982 | Archer | |
| 5,408,150 A * | 4/1995 | Wilcox | ........................ 327/108 |
| 6,256,215 B1 | 7/2001 | Barrett et al. | |
| 6,781,423 B1 * | 8/2004 | Knoedgen | ...................... 327/110 |
| 6,900,600 B2 * | 5/2005 | Rust et al. | ...................... 315/291 |
| 6,909,252 B2 * | 6/2005 | Xi | ............................. 318/400.29 |
| 7,259,611 B2 | 8/2007 | Tanimoto et al. | |

OTHER PUBLICATIONS

Park, Shihong et al., "A Self-Boost Charge Pump Topology for a Gate Drive High-Side Power Supply," Eighteenth Annual IEEE: Applied Power Electronics Conference and Exposition, Feb. 2003, (1)1:126-131.

Dunn, William C., "Driving and Protection of High Side NMOS Power Switches," IEEE Transactions on Industry Applications, Jan./Feb. 1992, 28(1):26-30.

* cited by examiner

*Primary Examiner* — Kenneth B. Wells
(74) *Attorney, Agent, or Firm* — Frommer Lawrence & Haug LLP; Matthew M. Gaffney

(57) ABSTRACT

The invention relates to an apparatus and method for driving high-side switching devices in an H-Bridge circuit. The apparatus includes first and second N-Channel high-side switching devices. Each of the high-side switching devices is associated with, and is selectively driven by, a driver circuit. Each of the driver circuits is associated with, and is powered from, a bootstrap capacitor. The apparatus further includes a cross-couple circuit that is arranged to charge each of the bootstrap capacitors based, at least in part, on whether the low-side switching device that is associated with the other bootstrap capacitor is open or closed.

21 Claims, 5 Drawing Sheets

US 8,022,746 B1

BOOTSTRAP CIRCUIT FOR H-BRIDGE STRUCTURE UTILIZING N-CHANNEL HIGH-SIDE FETS

TECHNICAL FIELD

The invention is generally directed to the area of H-Bridge circuits. The invention is directed, particularly, but not exclusively to a method and apparatus for driving high-side switching devices in an H-Bridge circuit.

BACKGROUND

H-Bridge circuits may be employed as power switching circuits. For example, H-Bridge circuits may be employed as drive circuitry for electrical motors, as drive circuitry for electroluminescent lamp circuits, as DC/AC inverter circuitry, and as regulator output circuitry in switching regulators. Further H-Bridge circuits are employed in a variety of other applications and circuits.

In these and other applications, H-Bridge circuits may be employed to selectively control a direction of current flow through, or the polarity of voltage to, an element. The element may be an inductor, a motor, an electroluminescent lamp circuit, a coil of a transformer, a solenoid, an electrical device, an electrical component, and/or the like.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified. These drawings are not necessarily drawn to scale.

For a better understanding of the present invention, reference will be made to the following Detailed Description, which is to be read in association with the accompanying drawings, wherein.

DETAILED DESCRIPTION

Figure 1:
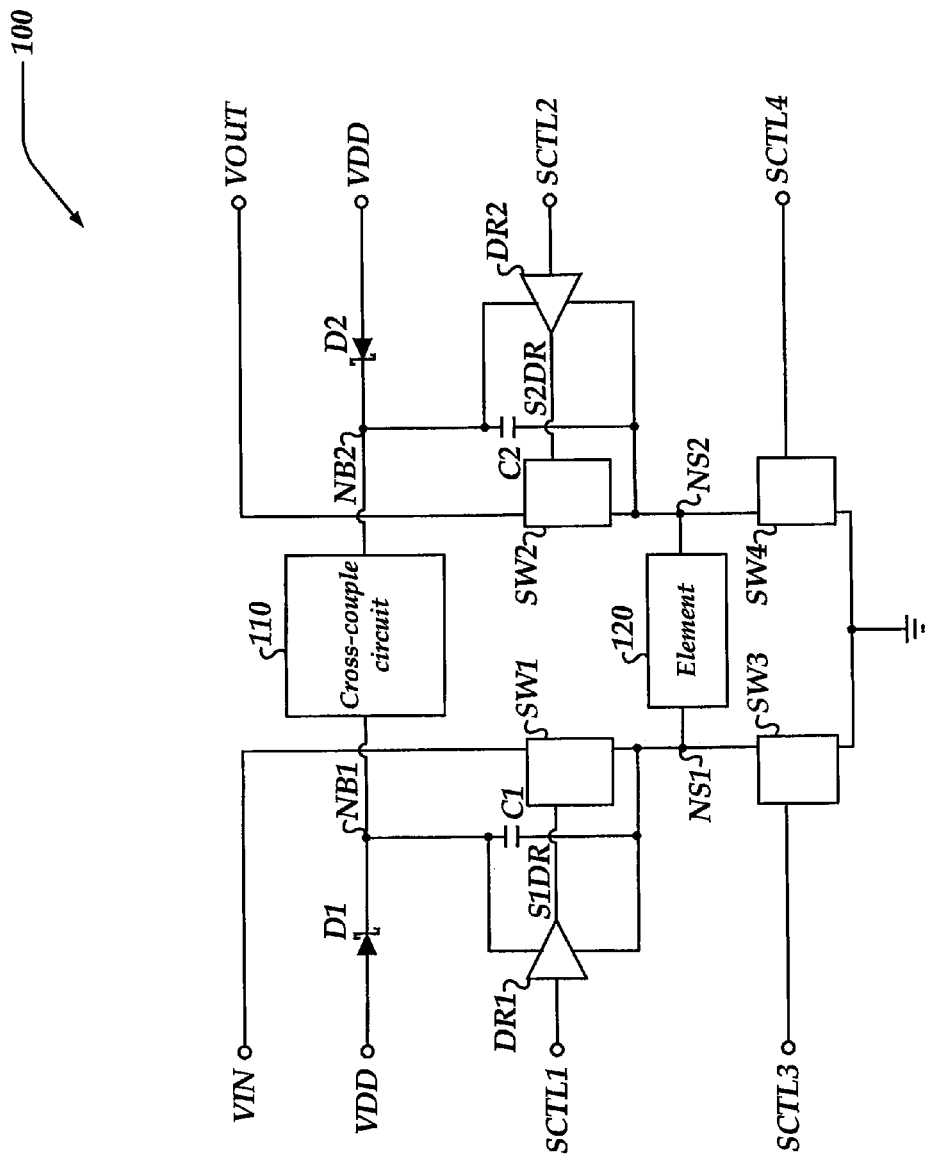
FIG. 1 is a block diagram of an embodiment of a circuit according to aspects of the present invention.

Various embodiments of the present invention will be described in detail with reference to the drawings. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference. References in the singular are made merely for clarity of reading and include plural reference unless plural reference is specifically excluded. The meaning of either "in" or "on" includes both "in" and "on." The term "or" is an inclusive "or" operator, and is equivalent to the term "and/or" unless specifically indicated otherwise. The term "based on" or "based upon" is not exclusive and is equivalent to the term "based, at least in part, on" and includes being based on additional factors, some of which are not described herein. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function or functions. The term "signal" means at least one current, voltage, charge, temperature, data, or other signal. A "signal" may be used to communicate using active high, active low, time multiplexed, synchronous, asynchronous, differential, single-ended, or any other digital or analog signaling or modulation techniques. A "signal" may also be employed to provide and/or transmit power. Where either a field effect transistor (FET) or a bipolar transistor may be employed as an embodiment of a transistor, the scope of the words "gate", "drain", and "source" includes "base", "collector", and "emitter", respectively, and vice versa. A FET or bipolar transistor is "closed" when the status of the transistor is such that there is a current path through the transistor. A FET or bipolar transistor is "open" when the status of the transistor is such that there is substantially no current path through the transistor. However, while a transistor is open, some leakage current may flow through the transistor. The phrase "in one embodiment," as used herein does not necessarily refer to the same embodiment, although it may.

Briefly stated, the invention relates to an apparatus and method for driving high-side switching devices in an H-Bridge circuit. The apparatus includes first and second N-Channel high-side switching devices. Each of the high-side switching devices is associated with, and is selectively driven by, a driver circuit. Each of the driver circuits is associated with, and is powered from, a bootstrap capacitor. The apparatus further includes a cross-couple circuit that is arranged to charge each of the bootstrap capacitors based, at least in part, on whether the low-side switching device that is associated with the other bootstrap capacitor is open or closed.

FIG. 1 is a block diagram of an embodiment of circuit 100. Circuit 100 may include switching devices SW1-SW4, driver circuits DR1 and DR2, bootstrap capacitors C1 and C2, bootstrap diodes D1 and D2, cross-couple circuit 110, and element 120.

In one embodiment, circuit 100 is arranged as buck/boost regulator output circuitry to regulate regulated power signal VOUT to a substantially constant voltage over a range of input voltages of input power signal VIN. For example, circuit 100 may be arranged to regulate regulated power signal VOUT to +12 volts, +3.3 volts, +1.8 volts, and/or the like.

As illustrated, circuit 100 is coupled to positive input power supply signal VIN and to ground. However, in other embodiments, circuit 100 may be coupled between a positive input power supply and a negative input power supply, between ground and a negative power supply, between two positive power supplies, and/or the like.

In one embodiment, switching devices SW1-SW4 are arranged in an H-Bridge configuration to selectively couple first switch node NS1 to input power signal VIN or to ground and to selectively couple second switch node NS2 to regulated power signal VOUT or to ground. Switching devices SW1-SW4 may include N-Channel FETs, such as MOSFETs, junction field-effect transistors (JFETs), insulated gate bi-polar transistors (IGBTs), and/or the like. However, in other embodiments, P-Channel FETs, BJTs, relays, other electrically controlled switching devices, and/or the like, may also be suitably employed in switching devices SW1-SW4.

In one embodiment, driver circuit DR1 is arranged to provide drive signal S1DR to switching device SW1 based, at least in part, on switch control signal SCTL1. Also, in one embodiment, driver circuit DR2 is arranged to provide drive signal S2DR to switching device SW2 based, at least in part, on switch control signal SCTL2. Level-shift circuits, inverting or non-inverting buffers, amplifier circuits, comparators, and/or the like, may be employed in driver circuits DR1 and DR2. In one embodiment, low-side driver circuits may also be provided to provide drive signals to switching devices SW3 and SW4.

In one embodiment, driver circuits DR1 and DR2 include level-shift circuits that provide output logic levels that are respectively referenced to the voltage at nodes NS1 and NS2. By respectively referencing driver circuits DR1 and DR2 to the voltage at nodes NS1 and NS2, driver circuits DR1 and DR2 may be enabled to provide drive signals S1DR and S2DR to drive N-Channel devices in switching devices SW1 and SW2 while the voltages at nodes NS1 and NS2 are not substantially equal to ground.

Bootstrap capacitors C1 and C2 are respectively arranged to provide power to driver circuits DR1 and DR2. Bootstrap capacitors C1 and C2 are further arranged to be charged based, at least in part, on whether switching devices SW3 and SW4 are open or closed. For example, in one embodiment, circuit 100 is arranged such that capacitor C1 is charged via bootstrap diode D1 while switching device SW3 is closed and is charged via cross-couple circuit 110 while switching device SW4 is closed. Likewise, in this embodiment, circuit 100 is arranged such that capacitor C2 is charged via bootstrap diode D2 while switching device SW4 is closed and is charged via cross-couple circuit 110 while switching device SW3 is closed.

Bootstrap capacitors C1 and C2 may each be any type of capacitor. For example, bootstrap capacitors C1 and C2 may be ceramic capacitors (e.g., X5R, NPO, or X7R), tantalum capacitors, electrolytic capacitors, paper capacitors, plastic film capacitors, glass capacitors, and/or the like. Also, bootstrap capacitors C1 and C2 may be formed on a monolithic integrated circuit. Further, the capacitance value each of bootstrap capacitors C1 and C2 may be any suitable value. In one embodiment, the capacitance value is selected based, at least in part, on the power requirements of driver circuits DR1 and DR2; the drive requirements of switching devices SW1 and SW2; the expected duty-cycles for switching device SW1-SW4; and/or the like.

In one embodiment, bootstrap diodes D1 and D2 are arranged such that substantially no current flows from node NB1 to bootstrap power signal VDD or from node NB2 to bootstrap power signal VDD while enabling current flow from bootstrap power signal VDD to nodes NB1 and NB2. Bootstrap diodes D1 and D2 may be Schottky or other fast acting diodes. However, any other suitable diode may be employed as bootstrap diodes D1 and D2. Also, bootstrap power signal VDD may be provided from any suitable power source. For example, bootstrap power signal VDD may be provided from input power signal VIN, from a battery, from a regulator, and/or the like. In one embodiment, bootstrap power signal VDD is provided by a low dropout or other linear regulator.

In one embodiment, cross-couple circuit 110 is arranged to charge bootstrap capacitor C1 based, at least in part, on whether switching device SW4 is open or closed and is further arranged to charge bootstrap capacitor C2 based, at least in part, on whether switching device SW3 is open or closed. Cross-couple circuit 110 is described in further detail below, for certain embodiments.

Element 120 may be an inductor, a motor, an electroluminescent lamp circuit, a coil of a transformer, a solenoid, an electrical device, an electrical component, and/or the like, through which a direction of current flow, or a polarity of voltage to, may be selectively controlled. For example, circuit 100 may provide a current path from node NS1, through element 120, to node NS2 by closing switching devices SW1 and SW4. Likewise, circuit 100 may provide a current path from node NS2, through element 120, to node NS1 by closing switching devices SW2 and SW3. Element 120 may be virtually any device through which current may flow.

Figure 2:
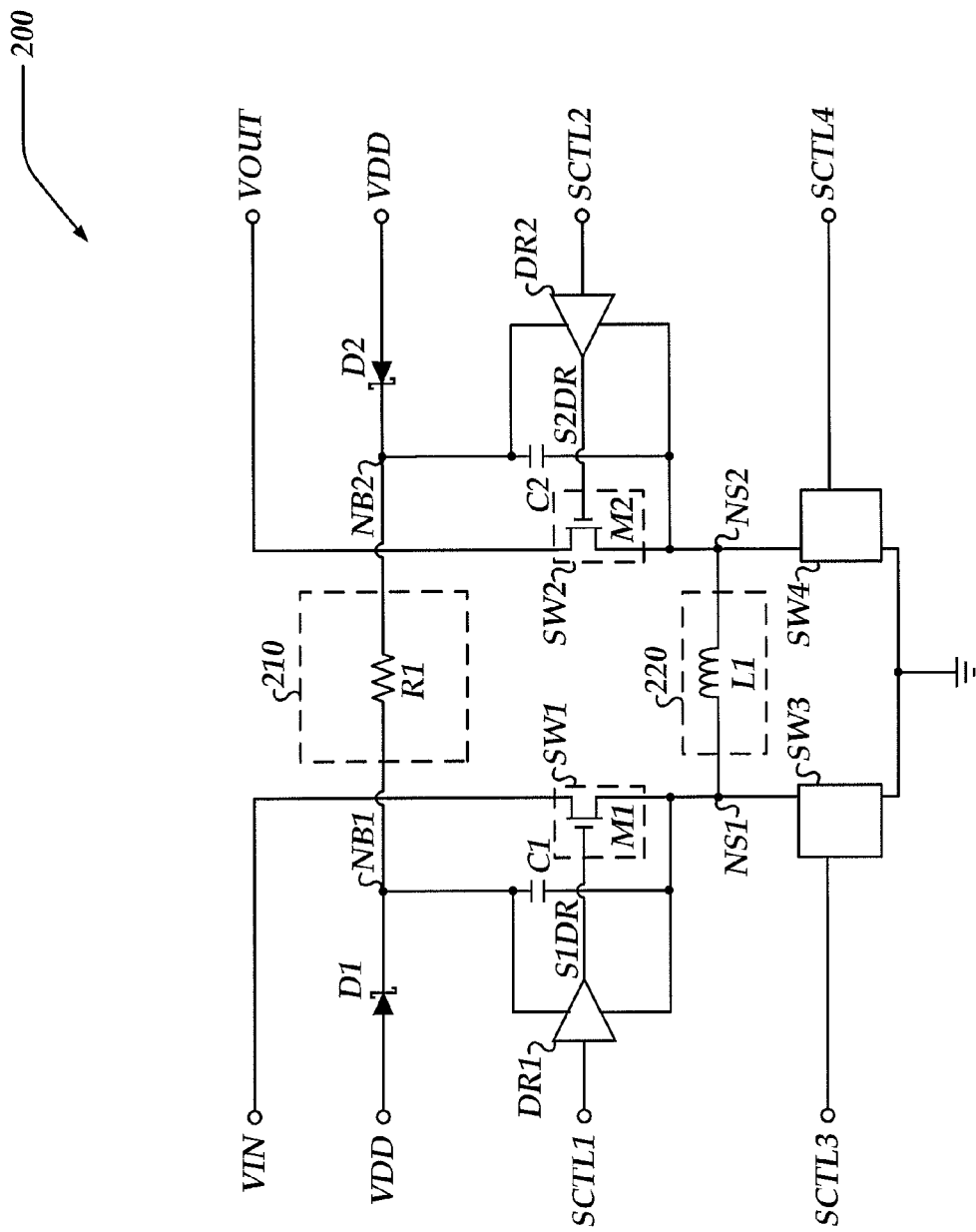
FIG. 2 is a schematic diagram of another embodiment of a circuit according to aspects of the present invention.

FIG. 2 is a schematic diagram of an embodiment of circuit 200. Circuit 200 may be employed as an embodiment of circuit 100 of FIG. 1. Circuit 200 may include switching devices SW1-SW4, driver circuits DR1 and DR2, bootstrap capacitors C1 and C2, bootstrap diodes D1 and D2, cross-couple circuit 210, and element 220. In one embodiment, circuit 200 is arranged to operate as regulator output circuitry in a buck/boost regulator.

Cross-couple circuit 210 may include resistor R1. In one embodiment, resistor R1 is coupled between nodes NB1 and NB2 such that capacitor C1 may be charged via resistor R1 while switching device SW4 is closed and such that capacitor C2 may be charged via resistor R1 while switching device SW3 is closed.

In one embodiment, the value of resistor R1 defines, in part, an RC time constant that is related to the charging characteristics of capacitors C1 and C2. Accordingly, the value of R1 may be selected to define the RC time constant at any suitable value. In one embodiment, the value of resistor R1 is less than approximately 1 MegaOhm. However, in certain embodiments, the range of suitable values of resistor R1 includes values spanning orders of magnitude (e.g., 100 Ohms-10 MegaOhms).

Switching devices SW1 and SW2 may respectively include N-Channel FETs M1 and M2. In one embodiment, N-Channel FETs M1 and M2 are enhancement mode MOSFETs. However, JFETs, IGBTs, and/or the like, may also be employed in switching devices SW1 and SW2 instead of N-Channel FETs. These and other variations are within the spirit and scope of the invention.

Element 220 may include inductor L1 that is coupled between nodes NS1 and NS2. Inductor L1 may be any suitable inductor.

Switching devices SW3 and SW4, driver circuits DR1 and DR2, bootstrap capacitors C1 and C2, and bootstrap diodes D1 and D2 may be employed as respective embodiments of switching devices SW3 and SW4, driver circuits DR1 and DR2, bootstrap capacitors C1 and C2, and bootstrap diodes D1 and D2 of FIG. 1.

In one embodiment, circuit 200 is arranged operate as output circuitry for a synchronously rectified switching buck/boost regulator by selectively coupling input power signal VIN to inductor L1 of element 220 and by selectively coupling inductor L1 to regulated power signal VOUT. In another embodiment, an asynchronously rectified switching buck/boost regulator may be provided. For example, switching devices SW3 and SW4 may include asynchronous rectification devices (e.g., diodes).

In one example of buck mode operation, while switching device SW4 is held opened and switching device SW2 is held closed, switching devices SW1 and SW3 are switched to selectively couple input power signal VIN or ground to inductor L1 of element 220. While switching device SW1 is closed, switching device SW3 is open and energy is provided from input power signal VIN to inductor L1, at node NS1, and to regulated power signal VOUT. At some point, switching device SW1 is opened and switching device SW3 is closed to provide rectification. Current then flows from ground to inductor L1, at node NS1. This cycle repeats on a periodic basis.

In an example of boost mode operation, while switching device SW3 is held opened and switching device SW1 is held closed, switching devices SW2 and SW4 are switched to selectively couple inductor L1 of element 220, at node NS2, to regulated power signal VOUT or ground. While switching device SW4 is closed, switching device SW2 is open to isolate regulated power signal VOUT from ground. At some point, switching device SW4 is opened and switching device SW2 is closed. Energy then flows from inductor L1 to regulated power signal VOUT. This cycle repeats on a periodic basis.

In the operation of one embodiment, one of driver circuits DR1 or DR2 is switching its associated switching device (e.g., not holding it closed) regardless of whether circuit 200 is providing buck mode regulation or boost mode regulation. Based on this switching, the bootstrap capacitor associated with the switching driver circuit will charge via its associated bootstrap diode and the bootstrap capacitor associated with the other driver circuit will be charged via cross-couple circuit 210.

Figure 3:
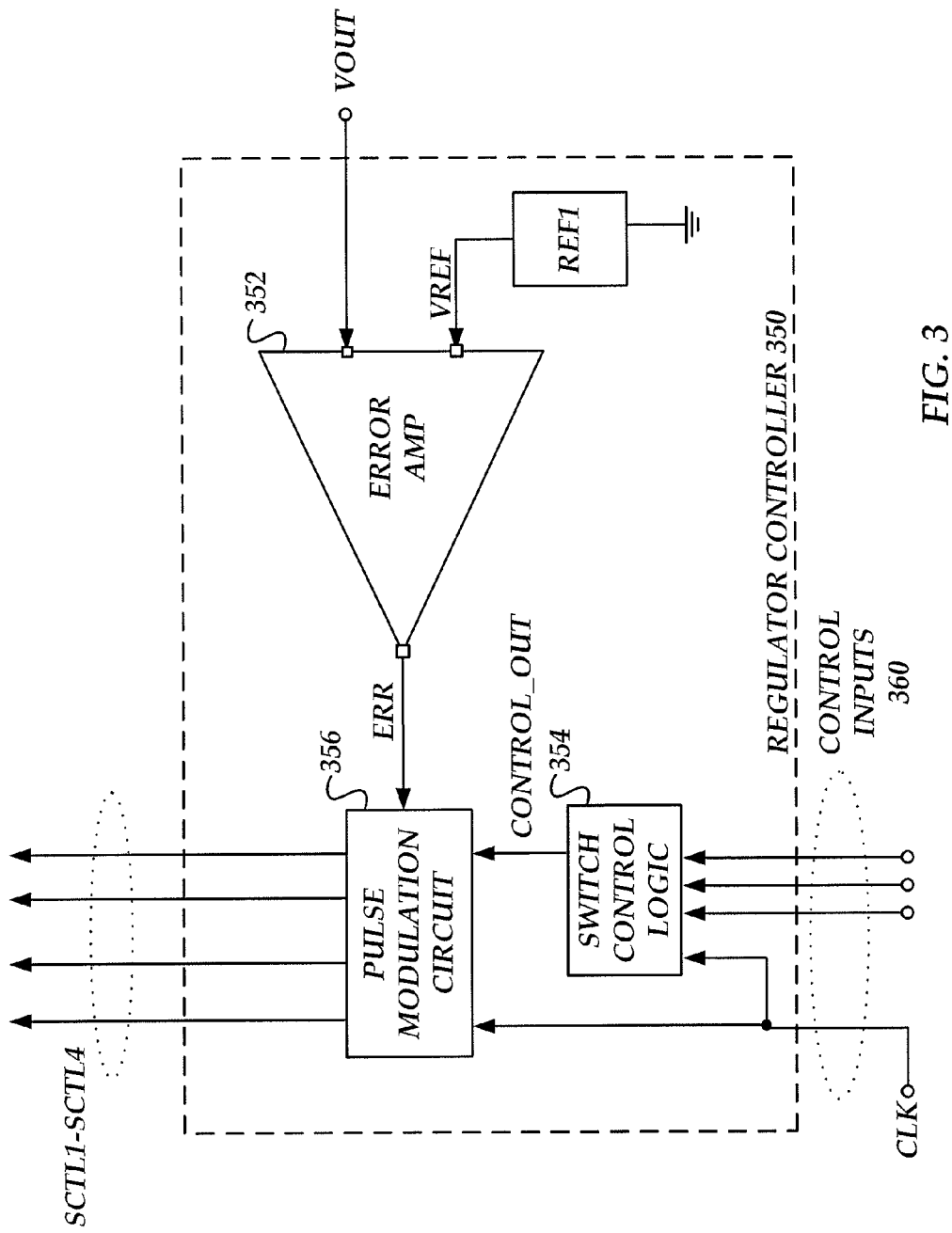
FIG. 3 is a block diagram of an embodiment of a regulator controller according to aspects of the present invention.

FIG. 3 is a block diagram of an embodiment of regulator controller 350. Regulator controller 350 includes reference source REF1, error amplifier 352, switch control logic 354, and pulse modulation circuit 356. Regulator controller 350 may be employed, for example, to control the operation of circuit 200 of FIG. 2 by monitoring regulated power signal VOUT or another output signal relative to signal VREF and by modulating switch control signals SCTL1-SCTL4 based, at least in part, on such monitoring.

In one embodiment, error amplifier 352 is arranged to provide error signal ERR based on the difference between regulated power signal VOUT and reference signal VREF. Although not shown, error amplifier 352 may also include compensation circuitry. In other embodiments, other circuitry may be employed instead of error amplifier 352. For example, other differential amplifier circuits, instrumentation amplifiers, analog or digital comparators, operational amplifiers, ring analog-to-digital converters, controller analog-to-digital converters, and/or the like, may be suitably employed instead of error amplifier 352. In one embodiment, a controller analog-to-digital converter, such as described by U.S. Pat. No. 7,250,884 to Hee Wong, is employed. The entirety of U.S. Pat. No. 7,250,884 is hereby incorporated by reference.

Reference signal VREF is provided by reference source REF1. Reference source REF1 may be either internal or external and may provide a reference voltage of any suitable value. For example, reference source REF1 may include a band-gap reference circuit. In other embodiments, a reference current source may be suitably employed instead of a reference voltage source.

In one embodiment, switch control logic 354 is arranged to receive control inputs 360 and to provide one or more control signals CONTROL_OUT to pulse modulation circuit 356. Signal(s) CONTROL_OUT may be employed to indicate an operational mode (e.g. buck, boost, PFM, PWM, startup, shutdown, etc.); to modify switching thresholds; to adjust timing; and/or the like. Control signals 360 may include clock signal CLK, various reference voltages, load current limits, load current indicators, input current limits, input current indicators, temperature limits, temperature indicators, compensation signals, mode selection signals, and/or the like.

Pulse modulation circuit 356 is arranged provide switch control signals SCTL1-SCTL4 based on signals ERR, CONTROL_OUT, and/or CLK. In one embodiment, pulse modulation circuit 356 includes a pulse width modulation (PWM) circuit. In other embodiments, pulse modulation circuit 356 may include a pulse frequency modulation (PFM) circuit, a charge transfer modulation (CTM) circuit, hybrid circuits, and/or the like.

In some embodiments, regulator controller 350 may differ from the illustrated embodiment. For example, regulator controller 350 may include over-voltage protection circuitry, under-voltage protection circuitry, over-current protection circuitry, under-current protection circuitry, temperature protection circuitry, or battery status monitoring circuitry; regulator controller 350 may be arranged as a current mode regulator controller; and/or the like. These and other variations are within the spirit and scope of the invention.

Figure 4:
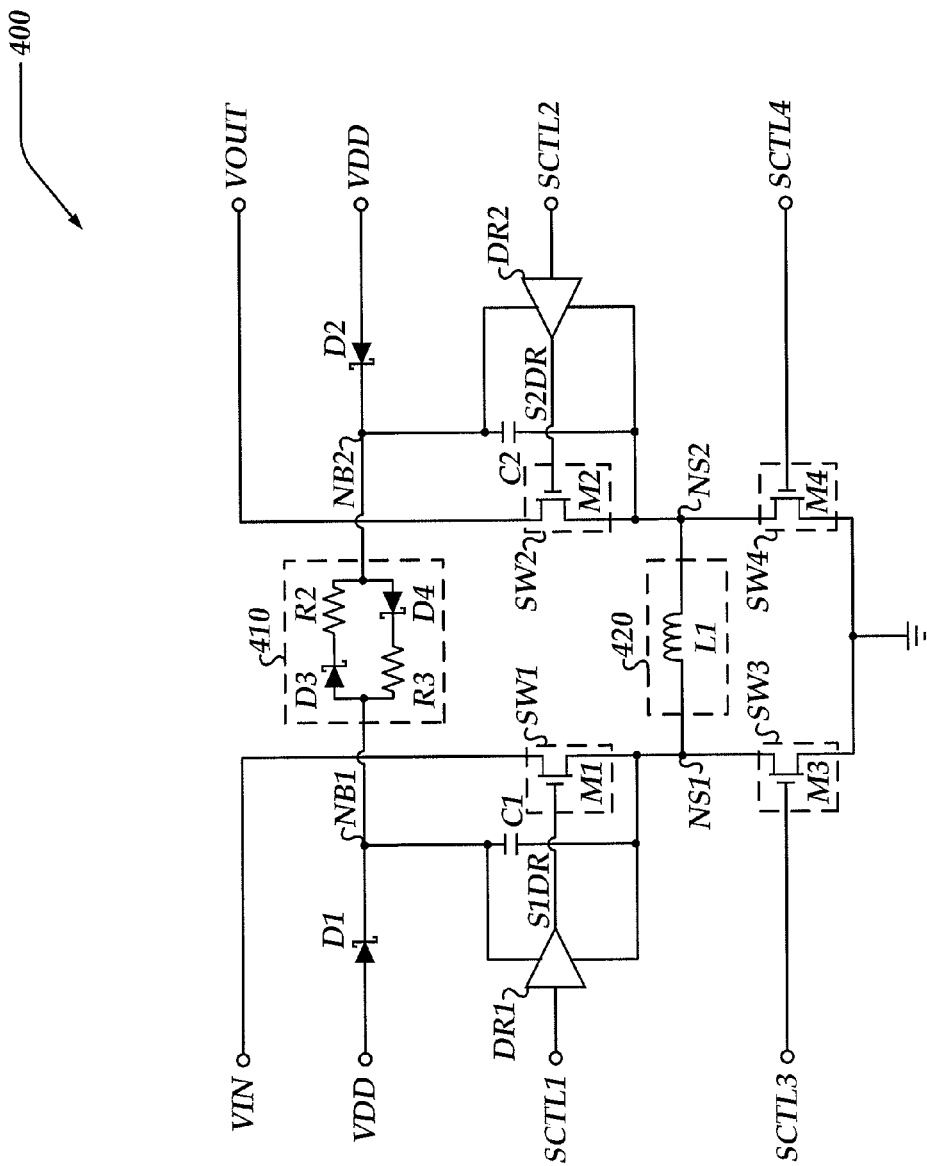
FIG. 4 is a schematic diagram of yet another embodiment of a circuit according to aspects of the present invention.

FIG. 4 is a schematic diagram of an embodiment of circuit 400. Circuit 400 may be employed as an embodiment of circuit 100 of FIG. 1. Circuit 400 may include switching devices SW1-SW4, driver circuits DR1 and DR2, bootstrap capacitors C1 and C2, bootstrap diodes D1 and D2, cross-couple circuit 410, and element 420. In one embodiment, circuit 400 is arranged to operate as regulator output circuitry in a buck/boost regulator.

In one embodiment, cross-couple circuit 410 includes resistors R2 and R3 and cross-couple diodes D3 and D4. Resistors R2 and R3 and cross-couple diodes D3 and D4 are arranged such that the RC time constants for each of bootstrap capacitors C1 and C2 is separately defined. This, for example, may simplify circuit design if driver circuit DR1 has different power requirements than those of driver circuit DR2; if switching device SW1 is different from switching device SW2; if different capacitors are employed for bootstrap capacitors C1 and C2; if switching devices SW1 and SW2 are expected to have different duty-cycles; and/or the like. Further, in one embodiment, different voltages (not shown) are applied to the anodes of each of bootstrap diodes D1 and D2. In these and other embodiments, resistors R2 and R3 may be selected such that the RC time constants for each of bootstrap capacitors C1 and C2 are substantially equal. However, resistors R2 and R3 may also be selected such that the RC time constants for each of bootstrap capacitors C1 and C2 are different.

In one embodiment, cross-couple diodes D3 and D4 are Schottky or other fast acting diodes that are arranged such that bootstrap capacitor C1 may be charged via bootstrap diode D2, cross-couple diode D4, and resistor R3 and such that bootstrap capacitor C2 may be charged via bootstrap diode D1, cross-couple diode D3, and resistor R2. However, other suitable diodes may be employed as diodes D3 and D4.

Also, switching devices SW3 and SW4 of circuit 400, as shown in FIG. 4, respectively include N-Channel FETs M3 and M4. However, as discussed above, other switching devices may be employed in switching devices SW3 and SW4 instead of N-Channel FETs.

Switching devices SW1 and SW2, driver circuits DR1 and DR2, bootstrap capacitors C1 and C2, bootstrap diodes D1 and D2, and element 420 may be employed as respective embodiments of switching devices SW1 and SW2, driver circuits DR1 and DR2, bootstrap capacitors C1 and C2, bootstrap diodes D1 and D2, and element 120 of FIG. 1.

Figure 5:
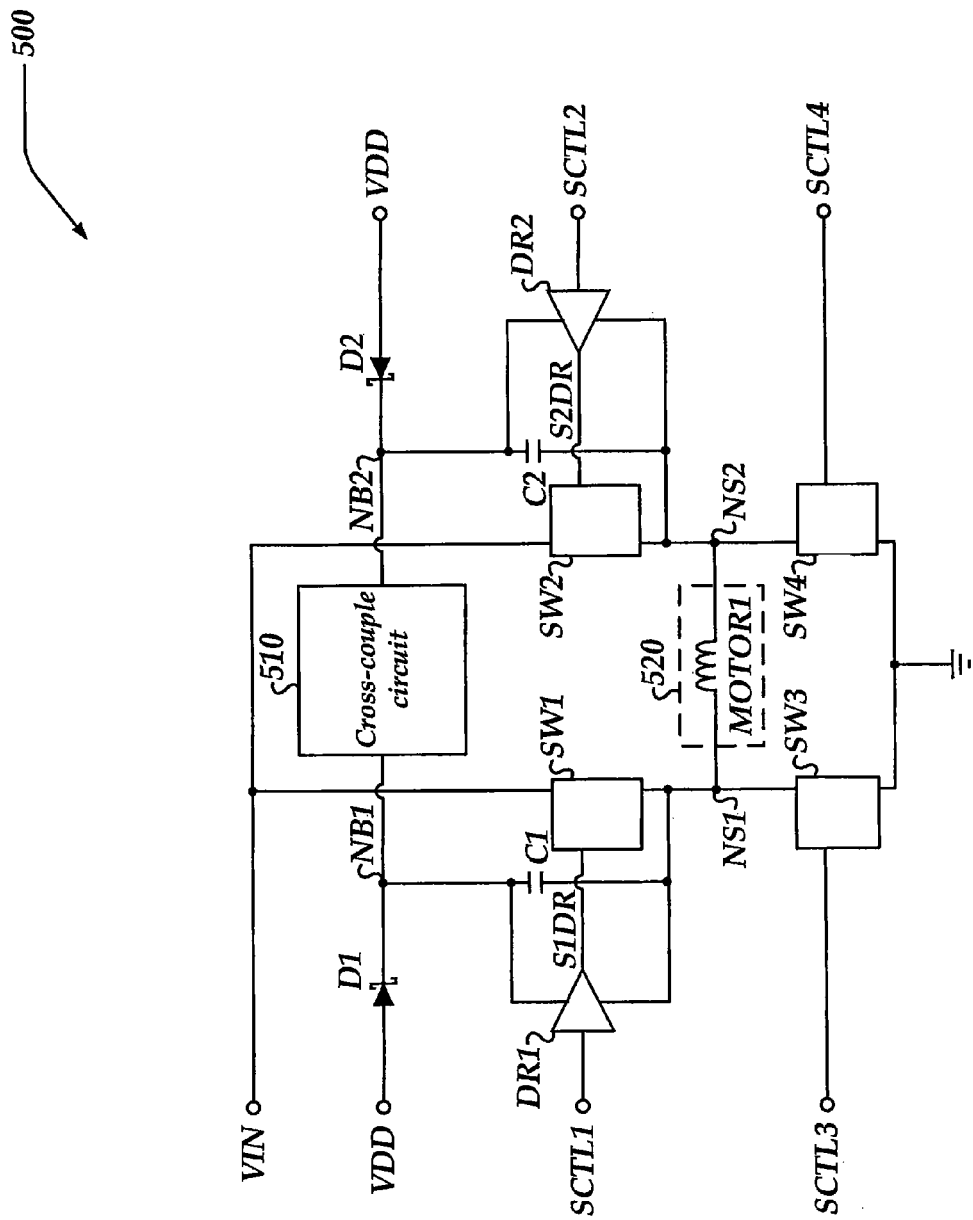
FIG. 5 is a schematic diagram of a further embodiment of a circuit according to aspects of the present invention.

FIG. 5 is a schematic diagram of an embodiment of circuit 500. Circuit 500 may be employed as an embodiment of circuit 100 of FIG. 1. Circuit 500 may include switching devices SW1-SW4, driver circuits DR1 and DR2, bootstrap capacitors C1 and C2, bootstrap diodes D1 and D2, cross-couple circuit 510, and element 520. In one embodiment, circuit 500 is arranged to operate as motor control circuitry to reversibly drive motor MOTOR1 of element 520.

In one embodiment, circuit 500 is arranged to selectively control a direction of current flow through, or the polarity of voltage to, element 520 by selectively providing a current path between input power signal VIN and ground. For example, circuit 500 may provide a current path from node NS1, through element 520, to node NS2 by closing switching devices SW1 and SW4. Likewise, circuit 500 may provide a current path from node NS2, through element 520, to node NS1 by closing switching devices SW2 and SW3. As discussed above, circuit 500 may be coupled between other voltage sources.

In one embodiment, element 520 includes motor MOTOR1. MOTOR1 may be, for example, a DC brushless motor, a linear motor, a stepper motor, a universal motor, a coreless DC motor, a brushed DC motor, a ball-bearing DC motor, and/or the like. In one embodiment, MOTOR1 is a stepper motor.

In other embodiments, an electroluminescent lamp circuit, a coil of a transformer, a solenoid, an electrical device, an electrical load, an electrical component, and/or the like, may be employed in element 520, or driven by circuit 500, instead of MOTOR1. These and other variations are within the spirit and scope of the invention.

Switching devices SW1-SW4, driver circuits DR1 and DR2, bootstrap capacitors C1 and C2, bootstrap diodes D1 and D2, and cross-couple circuit 510 may be employed as respective embodiments of switching devices SW1-SW4, driver circuits DR1 and DR2, bootstrap capacitors C1 and C2, bootstrap diodes D1 and D2, and cross-couple circuit 110 of FIG. 1.

The above specification, examples and data provide a description of the method and applications, and use of the invention. Since many embodiments of the invention can be made without departing from the spirit and scope of the invention, this specification merely set forth some of the many possible embodiments for the invention.

What is claimed as new and desired to be protected by Letters Patent of the United States is:

1. A circuit for providing power, comprising:
   a switching circuit, including:
      a first switching device;
      a second switching device;
      a third switching device; and
      a fourth switching device, wherein the first switching device, the second switching device, the third switching device, and the fourth switching device are arranged to operate as an H-Bridge circuit, and wherein the first switching device and the second switching device are arranged as high-side switching devices;
   a first driver circuit that is arranged to selectively drive the first switching device;
   a first bootstrap capacitor that is arranged to provide power to the first driver circuit;
   a second driver circuit that is arranged to selectively drive the second switching device;
   a second bootstrap capacitor that is arranged to provide power to the second driver circuit; and
   a cross-couple circuit that is arranged to enable charging of the first bootstrap capacitor via current through selectively either the cross-couple circuit or another current path that is distinct from the cross-couple circuit based, at least in part, on whether the fourth switching device is open or closed, wherein the cross-couple circuit is coupled between the first bootstrap capacitor and the second bootstrap capacitor.

2. The circuit of claim 1, wherein each of the first switching device and the second switching device includes at least one of: an N-Channel field-effect transistor (FET) or an N-Channel insulated-gate bipolar transistor (IGBT).

3. The circuit of claim 1, wherein the first bootstrap capacitor is further arranged to be charged based, in part, on whether the third switching device is open or closed.

4. The circuit of claim 1, wherein the first driver circuit is arranged to operate as a level-shifting circuit.

5. The circuit of claim 1, wherein the first driver circuit includes at least a first power terminal and a second power terminal, and wherein the first bootstrap capacitor is coupled between the first power terminal of the first driver circuit and the second power terminal of the first driver circuit.

6. The circuit of claim 1, wherein the cross-couple circuit is further arranged to enable charging of the second bootstrap capacitor via current through the cross-couple circuit based, at least in part, on whether the third switching device is open or closed.

7. The circuit of claim 6, wherein the cross-couple circuit includes:
   a resistor that is coupled between the first bootstrap capacitor and the second bootstrap capacitor.

8. The circuit of claim 6, wherein the cross-couple circuit includes:
   a first diode that is coupled to the first bootstrap capacitor;
   a first resistor that is coupled between the first diode and the second bootstrap capacitor;
   a second diode that is coupled to the second bootstrap capacitor; and
   a second resistor that is coupled between the second diode and the first bootstrap capacitor.

9. The circuit of claim 8, wherein the first diode and the second diode are Schottky diodes, and wherein the first resistor has an associated resistance value that is less than approximately 1 MegaOhm.

10. The circuit of claim 5, further comprising:
    a first bootstrap diode that is coupled between a power supply node and the first power terminal of the first driver circuit, wherein the second driver circuit includes at least a first power terminal and a second power terminal, and wherein the second bootstrap capacitor is coupled between the first power terminal of the second driver circuit and the second power terminal of the second driver circuit; and
    a second bootstrap diode that is coupled between the power supply node and the second power terminal of the second driver circuit,
    wherein the cross-coupled circuit and the first bootstrap diode are arranged to enable charging of the first bootstrap capacitor via current through the cross-couple circuit when the fourth switching device is closed, and to enable charging of the first bootstrap capacitor via current through the first bootstrap diode when the third switching device is closed; and wherein the cross-coupled circuit and the second bootstrap diode are arranged to enable charging of the second bootstrap capacitor via current through the cross-couple circuit when the third switching device is closed, and to enable charging via current through the second bootstrap diode when the fourth switching device is closed.

11. A circuit for providing power, comprising:
    a switching circuit, including:
       a first switching device that is coupled between an input node and a first switch node;
       a second switching device that is coupled at least to a second switch node;

a third switching device that is coupled between the first switch node and a common node; and a fourth switching device that is coupled between the second switch node and the common node;

a first driver circuit having at least a first power terminal and a second power terminal, wherein the first power terminal of the first driver circuit is coupled to a first bootstrap node and the second power terminal of the first driver circuit is coupled to the first switch node;

a first bootstrap capacitor that is coupled to the first bootstrap node and to the first switch node, wherein the first bootstrap capacitor is arranged to be charged via selectively either a current path between the first bootstrap node and a second bootstrap node or another current path that is distinct from the current path between the first bootstrap node and the second bootstrap node based, at least in part, on whether the third switching device is open or closed and on whether the fourth switching device is open or closed;

a second driver circuit having at least a first power terminal and a second power terminal, wherein the first power terminal of the second driver circuit is coupled to the second bootstrap node and the second power terminal of the second driver circuit is coupled to the second switch node; and a second bootstrap capacitor that is coupled to the second bootstrap node and to the second switch node.

12. The circuit of claim 11, wherein the first switching device, the second switching device, the third switching device, and the fourth switching device are arranged to operate as an H-Bridge circuit, and wherein the first switching device and the second switching device are arranged as high-side switching devices.

13. The circuit of claim 11, wherein the switching circuit is arranged to provide an output voltage or an output current at an output node, and wherein the second switching device is further coupled to the output node.

14. The circuit of claim 11, further comprising:
an inductor that is coupled between the first switch node and the second switch node; and
a regulator controller that is arranged to control at least the first switching device and the third switching device to provide buck mode power regulation, and that is further arranged to control at least the second switching device and the fourth switching device to provide boost mode power regulation.

15. The circuit of claim 11, further comprising:
a motor that is coupled between the first switch node and the second switch node.

16. The circuit of claim 11, wherein the second bootstrap capacitor is arranged to be charged via a current path between the first bootstrap node and the second bootstrap node based, at least in part, on whether the third switching device is open or closed and on whether the fourth switching device is open or closed.

17. The circuit of claim 11, further comprising:
a cross-couple circuit that is arranged to charge the first bootstrap capacitor while the fourth switching device is closed, and to charge the second bootstrap capacitor while the third switching device is closed.

18. The circuit of claim 17, wherein the cross-couple circuit includes:
a first diode that is coupled to the first bootstrap node;
a first resistor that is coupled between the first diode and the second bootstrap capacitor;
a second diode that is coupled to the second bootstrap node; and
a second resistor that is coupled between the second diode and the first bootstrap capacitor.

19. The circuit of claim 17, wherein the cross-couple circuit is coupled between the first bootstrap node and the second bootstrap node.

20. The circuit of claim 17, further comprising:
a first bootstrap diode having an anode and a cathode, wherein the cathode of the first bootstrap diode is coupled to the first bootstrap node and the anode of the first bootstrap diode is arranged to receive a bootstrap power signal; and
a second bootstrap diode having an anode and a cathode, wherein the cathode of the second bootstrap diode is coupled to the second bootstrap node and the anode of the second bootstrap diode is arranged to receive the bootstrap power signal.

21. A method of providing power, comprising:
employing a first driver circuit to selectively drive a first high-side N-Channel switching device of an H-Bridge circuit;
employing a second driver circuit to selectively drive a second high-side N-Channel switching device of the H-Bridge circuit;
selectively switching a first low-side switching device of the H-Bridge circuit, wherein the first low-side switching device is coupled to the first high-side switching device;
selectively switching a second low-side switching device of the H-Bridge circuit, wherein the second low-side switching device is coupled to the second high-side switching device;
charging a first bootstrap capacitor via selectively either a current path between the first bootstrap capacitor and the second bootstrap capacitor or another current path that is distinct from the current path between the first bootstrap capacitor and the second bootstrap capacitor based, at least in part, on whether the second low-side switching device is open or closed;
charging a second bootstrap;
employing the first bootstrap capacitor to power, at least in part, the first driver circuit; and
employing the second bootstrap capacitor to power, at least in part, the second driver circuit.

* * * * *